US006317324B1

(12) United States Patent
Chen et al.

(10) Patent No.: US 6,317,324 B1
(45) Date of Patent: Nov. 13, 2001

(54) ENCAPSULATED POWER SUPPLY WITH A HIGH THERMAL CONDUCTIVITY MOLDED INSERT

(76) Inventors: Shiaw-Jong Steve Chen, 3805 Solarium Pl., Plano, TX (US) 75075; Roger J. Hooey, 501 Prince La., Rockwall, TX (US) 75087

( * ) Notice: Subject to any disclaimer, the term of this patent is extended or adjusted under 35 U.S.C. 154(b) by 0 days.

(21) Appl. No.: 09/496,121

(22) Filed: Feb. 1, 2000

(51) Int. Cl.[7] ................................................. H05H 7/20
(52) U.S. Cl. .................. 361/704; 165/185; 174/16.3; 174/52.4; 257/796; 361/708; 361/715
(58) Field of Search ................... 165/80.2, 80.3, 165/185; 174/16.3, 52.4; 307/150; 257/706–707, 712–713, 796; 361/690, 704–708, 715, 717–719, 720; 363/141, 144

(56) References Cited

U.S. PATENT DOCUMENTS 5,381,304 * 1/1995 Theroux et al. ..................... 361/706
6,185,101 * 2/2001 Itabashi et al. ...................... 361/704

FOREIGN PATENT DOCUMENTS

2307441 * 11/1976 (FR) ..................................... 361/706

* cited by examiner

Primary Examiner—Gregory Thompson

(57) ABSTRACT

The present invention provides an encapsulant structure for retaining an electronic circuit having heat-generating components within a case that at least partially surrounds the electronic circuit. In one advantageous embodiment, the encapsulant structure provides for a thermally conductive insert to be located within the case proximate the heat-generating components. The insert increases the heat transfer efficiency from the electronic circuit to the case.

25 Claims, 4 Drawing Sheets

ENCAPSULATED POWER SUPPLY WITH A HIGH THERMAL CONDUCTIVITY MOLDED INSERT

TECHNICAL FIELD OF THE INVENTION

The present invention is directed, in general, to electronic circuit packaging and, more specifically, to an electronic circuit with heat generating components in which a relatively high thermal conductivity molded insert is encapsulated with the components to improve removal of heat from the components.

BACKGROUND OF THE INVENTION

To simplify the assembly of electronic devices, electronic components are frequently furnished to manufacturers in the form of preassembled modules containing whole circuits for performing a given function. The modules can then be advantageously handled in the assembly line as single parts of a larger whole, substantially speeding and simplifying the overall assembly process.

Power supplies adapt well to this preassembled module concept. Manufacturers of electronic systems (such as computers and telephone switches) therefore commonly acquire power supplies as preassembled modules from third party suppliers, rather than build them themselves. To protect the components and interconnections within the preassembled modules from environmental and handling damage, and to render them easier to handle during the assembly process, the modules are frequently encapsulated (or "potted") prior to further assembly.

Power supplies have shrunk in size and grown in power-handling capability over the years. Unfortunately, the resulting increase in power-handling capacity per unit of circuit volume (power density) has made such power supplies evermore difficult to encapsulate.

In general, encapsulating electronic components that require substantial heat removal has proven to be an intransigent problem. Ordinary potting materials do not have a coefficient of thermal conductivity sufficient to accommodate some of today's high thermal density components. Potting materials that have a high coefficient of thermal conductivity tend to be too viscous, resulting in the formation of cavities in the material. Guaranteeing the absence of cavities requires substantial time and care, resulting in a marked (perhaps four-fold) increase in manufacturing time. Even given the extra time, encapsulating machines tend to jam in their attempts to manage the thicker material, forcing the assembly line to be interrupted so the machines can be cleaned and restarted.

Accordingly, what is needed in the art is an improved way to encapsulate power supplies and heat-producing electronic components in general.

SUMMARY OF THE INVENTION

To address the above-discussed deficiencies of the prior art, the present invention provides an encapsulant structure for retaining an electronic circuit having heat-generating components within a case that at least partially surrounds the electronic circuit. In one advantageous embodiment, the encapsulant structure provides for a thermally conductive insert to be located within the case proximate the heat-generating components. The insert increases the heat transfer efficiency from the electronic circuit to the case. In a related embodiment, the encapsulant structure further includes a potting material, having a lower coefficient of thermal conductivity than the insert, that encapsulates both the electronic circuit and the insert.

The present invention therefore, in broad scope, introduces the concept of placing an insert that has a high rate of thermal conductivity in an encapsulated circuit proximate to the heat generating components in such circuit. Because the heat transfer characteristics of the insert are better than the potting material used to encapsulate the circuit, heat generated by the components in the circuit can be more efficiently conducted to the case of the encapsulated circuit, where it can be transferred to the surrounding ambient air.

In one embodiment of the invention, the thermally conductive insert has a general topographical conformity to the electronic circuit, which topographic shape places the insert in closer proximity to the heat generating components. In another embodiment of the invention, the thermally conductive insert is premolded. In still another embodiment, the thermally conductive insert is flexible and compliant, which advantageously permits the insert to be pressed around the encapsulated electronic circuit and eases the assembly process of manufacturing the encapsulant structure. In another embodiment of the invention, a plurality of thermally conductive inserts are located within the case.

Another aspect of the invention provides for the encapsulant structure to have a thermally conductive insert precut from sheets of material having a coefficient of thermal conductivity that is greater than the potting material. In a particularly favorable embodiment the insert can be placed in the case by a machine, such as a pick-and-place machine. In yet another embodiment, the precut thermally conductive insert is compressible. This is also particularly beneficial as the insert can be pressed around the components to assure close proximity between the insert and the heat generating components in the circuit.

The present invention also provides for a method of manufacturing an encapsulated electronic circuit having heat-generating components. The method, in one embodiment, comprises the provision of a case to at least partially surround the electronic circuit. A thermally conductive insert is located within the case proximate to the heat-generating components to increase a heat transfer efficiency from the electronic circuit to the case. In a related embodiment, the method further includes locating potting material, having a lower coefficient of thermal conductivity than the insert, in the case to encapsulate both the electronic circuit and the insert.

A particularly useful embodiment of the method of manufacturing calls for providing a case to at least partially surround the electronic circuit containing heat generating components. An initial layer of potting material is placed within the case and quick-cured. A thermally conductive insert is located within the case proximate the heat-generating components. Potting material, having a lower coefficient of thermal conductivity than the insert, in then located in the case to encapsulate both the electronic circuit and the insert. Another aspect of this method provides for the initial layer of potting material within the case to have a thickness of about 2 to 6 millimeters. Yet another aspect of this method is to quick cure wherein the initial layer of potting material within the case using a process selected from the group of an ultraviolet process and a microwave process.

The present invention also provides for an electronic device, comprised of a substrate adapted to receive electronic components and an encapsulant structure for an electronic circuit mounted on the substrate and having heat generating components. The encapsulant structure includes, in one embodiment, a case at least partially surrounding the electronic circuit and a thermally conductive insert located within the case proximate the heat-generating components. In a related embodiment, the encapsulant structure further includes a potting material, having a lower coefficient of thermal conductivity than the insert, to encapsulate both the electronic circuit and the insert so that the insert may increase the heat transfer efficiency from the electronic circuit to the case.

The foregoing has outlined, rather broadly, preferred and alternative features of the present invention so that those skilled in the pertinent art may better understand the detailed description of the invention that follows. Additional features of the invention will be described hereinafter that form the subject of the claims of the invention. Those skilled in the pertinent art should appreciate that they can readily use the disclosed conception and specific embodiment as a basis for designing or modifying other structures for carrying out the same purposes of the present invention. Those skilled in the pertinent art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
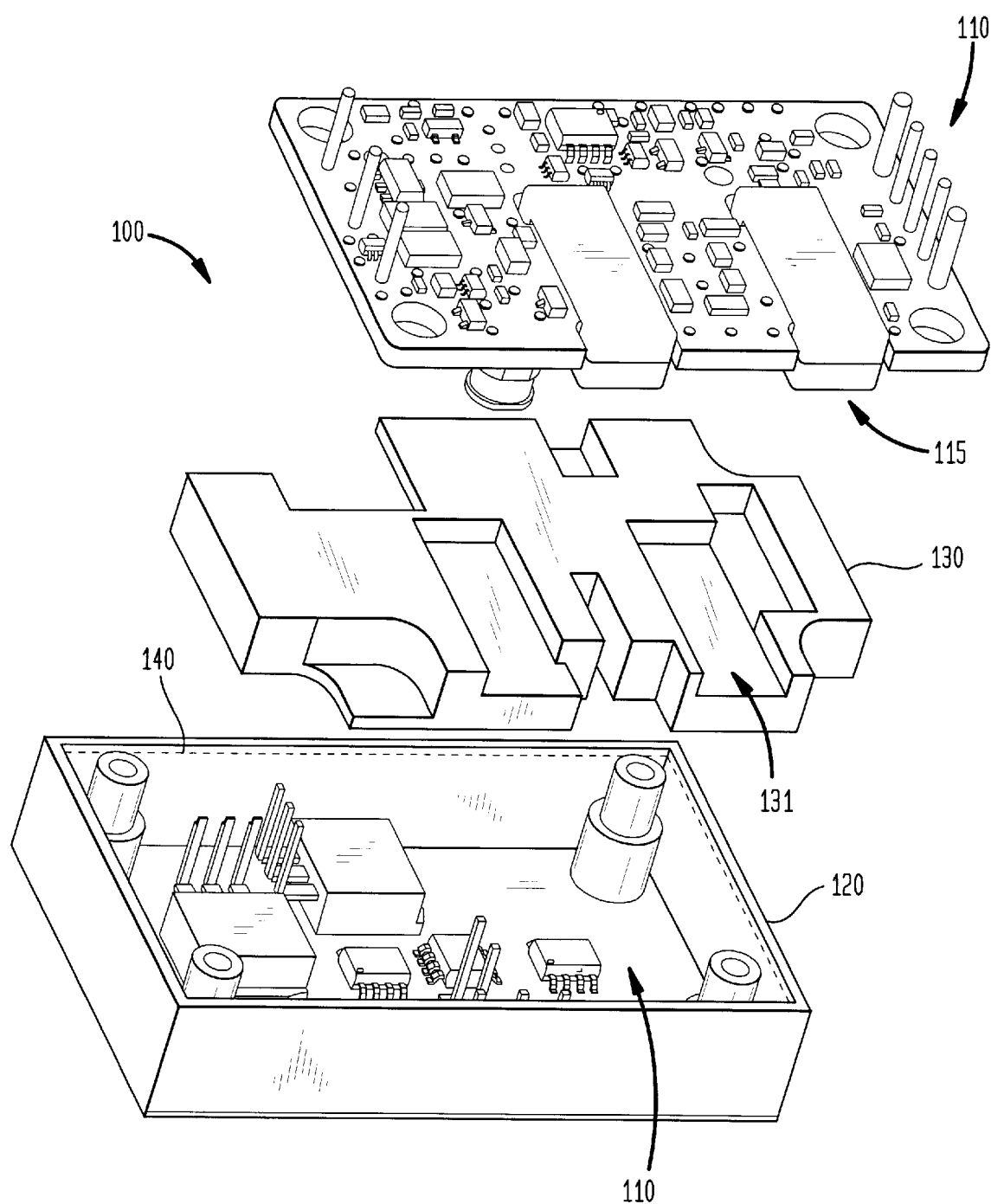
FIG. 1 illustrates an exploded isometric view of an embodiment of an electronic device constructed in accordance with the principles of the present invention.

Referring initially to FIG. 1, illustrated is an exploded isometric view of an embodiment of an electronic device 100 constructed in accordance with the principles of the present invention. The electronic device 100 (e.g., a power supply) includes an electronic circuit 110 having heat generating components (one of which is designated 115). In the illustrated embodiment, the electronic circuit 110 includes first and second substrates (such as printed wiring boards) adapted to receive electronic components (including the heat generating components 115). Of course, the electronic circuit 110 may be constructed on a single printed wiring board, or one or more of other types of substrates, as an application may dictate.

The electronic device 100 further includes a case 120 that at least partially surrounds the electronic circuit 110. The electronic device 100 still further includes an encapsulant structure that retains the electronic circuit 110 within the case 120. In the illustrated embodiment, the encapsulant structure includes a thermally conductive insert 130 that is located within the case 120. The thermally conductive insert 130 may comprise a polymer material, such as silicone or silicone gel, that exhibits a superior coefficient of thermal conductivity. The encapsulant structure further includes a potting material (difficult to illustrate given its amorphous nature, but indicated conceptually in FIG. 1 by a broken level fill line 140) having a lower coefficient of thermal conductivity than the thermally conductive insert 130. Of course, the potting material is not necessary to the present invention.

By providing the electronic device 100 as a modular, selfcontained subassembly, manufacturers of electronic equipment can include the electronic device 100 as a single discrete part as part of a larger electronic system. Such electronic devices 100 can be purchased in an encapsulated modular form from third party suppliers. Alternatively, the manufacturer itself can make the electronic circuit 110. As previously stated, power supplies, such as board mounted power supplies, are frequently furnished in such an encapsulated modular form.

When assembled, the electronic circuit 110 is located in the case 120, which substantially surrounds the electronic circuit 110. The thermally conductive insert 130 is located within the case 120 proximate the heat generating components 115 of the electronic circuit 110. The case 120 is then filled to a desired level with the potting material. The potting material in the illustrated embodiment has a relatively low viscosity (the better to dispense the potting material into the case 120).

Such potting material is usually poured by an assembly machine into the case 120 and allowed to cure. After the potting material hardens, the electronic device 100 becomes essentially a solid block, with electrical terminals or conductors projecting therefrom. Because the electronic device 100 is now a unitary structure, it can be handled as discrete part during the manufacturing process, even though, underneath the potting material, the thermally conductive insert 130 and the case 120, the electronic device 100 remains an electronic circuit 110 made up of multiple discrete components.

Because the standard polymer potting material generally used to encapsulate the electronic circuit 110 to form the electronic device 100 has a limited capacity to conduct heat, the present invention provides for the thermally conductive insert 130 to have a higher coefficient of thermal conductivity than the surrounding potting material. By placing the thermally conductive insert 130 proximate the heat generating components 115 on the electronic circuit 110, heat from the heat generating components 115 may be conducted by the thermally conductive insert 130 to the case 120. In situations where the thermally conductive insert 130 is in contact with both the heat generating component 115 and the case 120, a direct route is provided to conduct heat from the heat generating components 115 to the case 120.

In the illustrated embodiment of the present invention, the thermally conductive insert 130 has a general topographical conformity with the components (including the heat generating component 115) of the electronic circuit 110. The thermally conductive insert 130 has topographical features (one of which takes the form of an indentation 131) that allow the thermally conductive insert 130 to fit around the heat generating components 115. This is advantageous because it permits the thermally conductive insert 130 to be in close contact with the heat generating components 115 and thereby improves the transfer of heat from the heat generating components 115 to the thermally conductive insert 130. In one embodiment of the present invention, wherein the thermally conductive insert 130 comprises silicone, the thermally conductive insert 130 may be premolded. The indentation 131 may thus be formed as part of the molding process. In an alternative embodiment of the present invention, wherein the thermally conductive insert 130 comprises silicone gel, the thermally conductive insert 130 may be available in sheet form, and may need to be cut from the sheet.

Electronic components, such as the heat generating components 115 used in electrical circuits 110, frequently have an irregular shape. These irregular shapes, in combination with the multiplicity of smaller components usually found on the electronic circuit 110, may make it difficult and impractical to mold perfectly correct topographical features (such as the indentation 131) in the thermally conductive insert 130. One particularly beneficial embodiment of the invention addresses this problem by providing for the thermally conductive insert 130 to be flexible or compliant. This permits the thermally conductive insert 130 to be pressed down around the electrical circuit 110 and its irregularly shaped components during the assembly process. The thermally conductive insert 130 may thus conform to the topography of the electronic circuit 110 in this manner.

Figure 2:
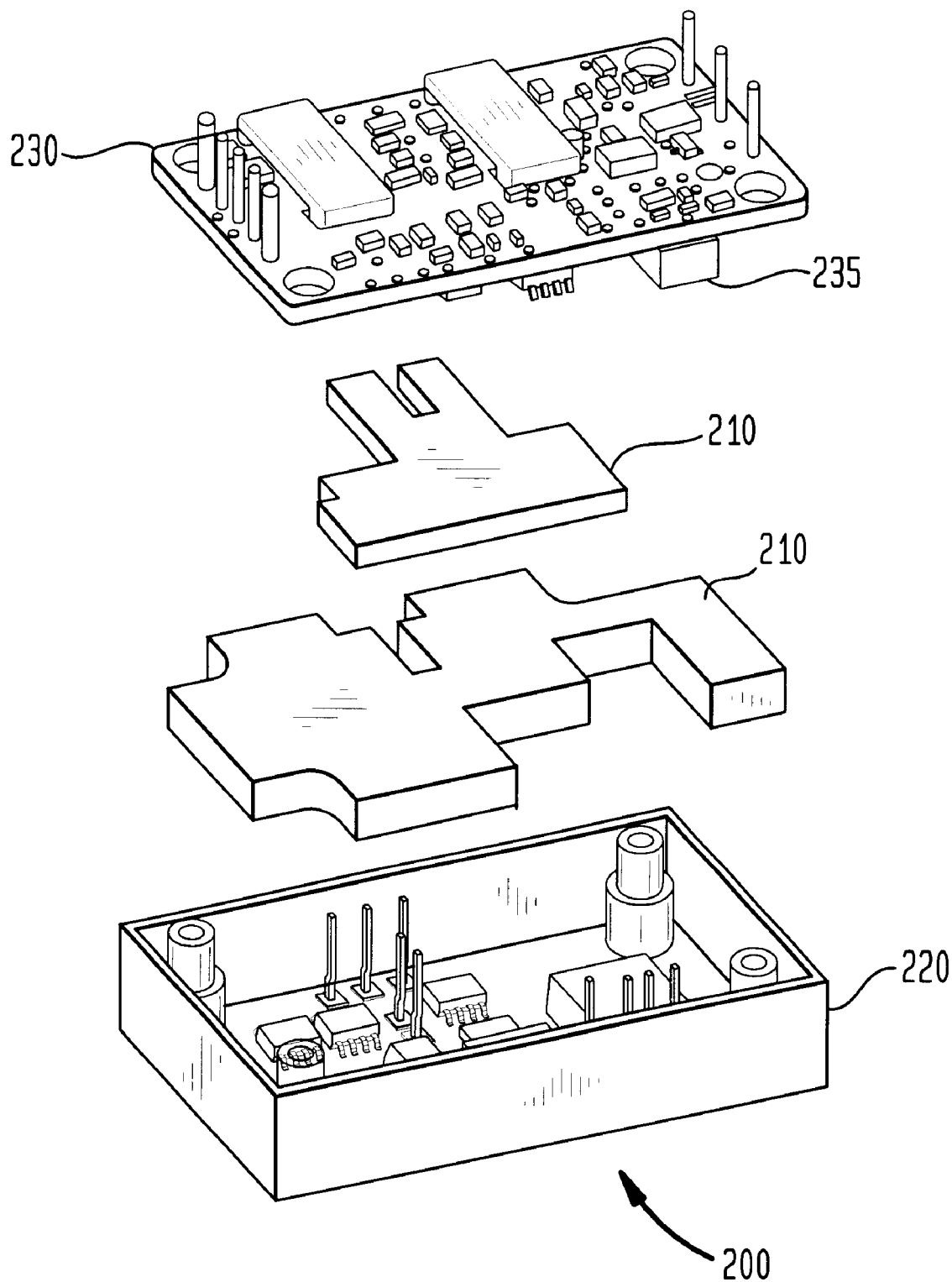
FIG. 2 illustrates an exploded isometric view of an encapsulant structure with a plurality of thermally conductive inserts located within the case.

Turning now to FIG. 2, illustrated is an exploded isometric view of another embodiment of an electronic device 200 constructed in accordance with the principles of the present invention. The electronic device 200 employs an encapsulant structure having a plurality of thermally conductive inserts 210 located within a case 220. Frequently, the structure of an electronic circuit 230 employed by the electronic device 200 requires that a number of thermally conductive inserts 210 be employed. For example, some electronic circuits 230 may have a design that requires a stack of the thermally conductive inserts 210 to provide a complete thermal path between heat generating components 235 employed in the electronic circuit 230 and the case 220. In other applications, the electronic circuit 230 may have widely separated heat generating components 235 or may be constructed on multiple printed wiring boards. In such instances, it may be efficient to use a multiple thermally conductive inserts 210 to conduct heat from the heat generating components 235 to the case 220.

In those cases where a flexible and compliant thermally conductive insert 210 (e.g., silicone gel) is used, some assembly machines may have handling problems, such as difficulty in picking up the thermally conductive inserts 210 and placing them into the cases 220 to form the electronic devices 200 described herein. To address this problem, the thermally conductive inserts 210 may be manufactured from a stiffer material, such as silicone. The thermally conductive inserts 210 may be precut from sheets of the material. These precut thermally conductive inserts 210 advantageously exhibit a coefficient of thermal conductivity greater than the surrounding potting material, but the relatively stiff composition of the thermally conductive inserts 210 can permit easy handling by the assembly machines, such as pick and place machines.

One embodiment of the invention provides for the precut thermally conductive inserts 210 to be cut from sheets of a compressible material. When the thermally conductive insert 210 is then placed into a case 220, the thermally conductive insert 210 can be pressed around the electronic circuit 230 and its heat generating components 235 to provide for positive contact between the heat generating components 235 and the thermally conductive insert 210. This feature provides for both ease of assembly and for more efficient heat control.

The present invention also provides a method of manufacturing the electronic device 200 described above. Those of skilled in the pertinent art will understand from the following description how to practice various embodiments of the method of manufacturing.

Figure 3:
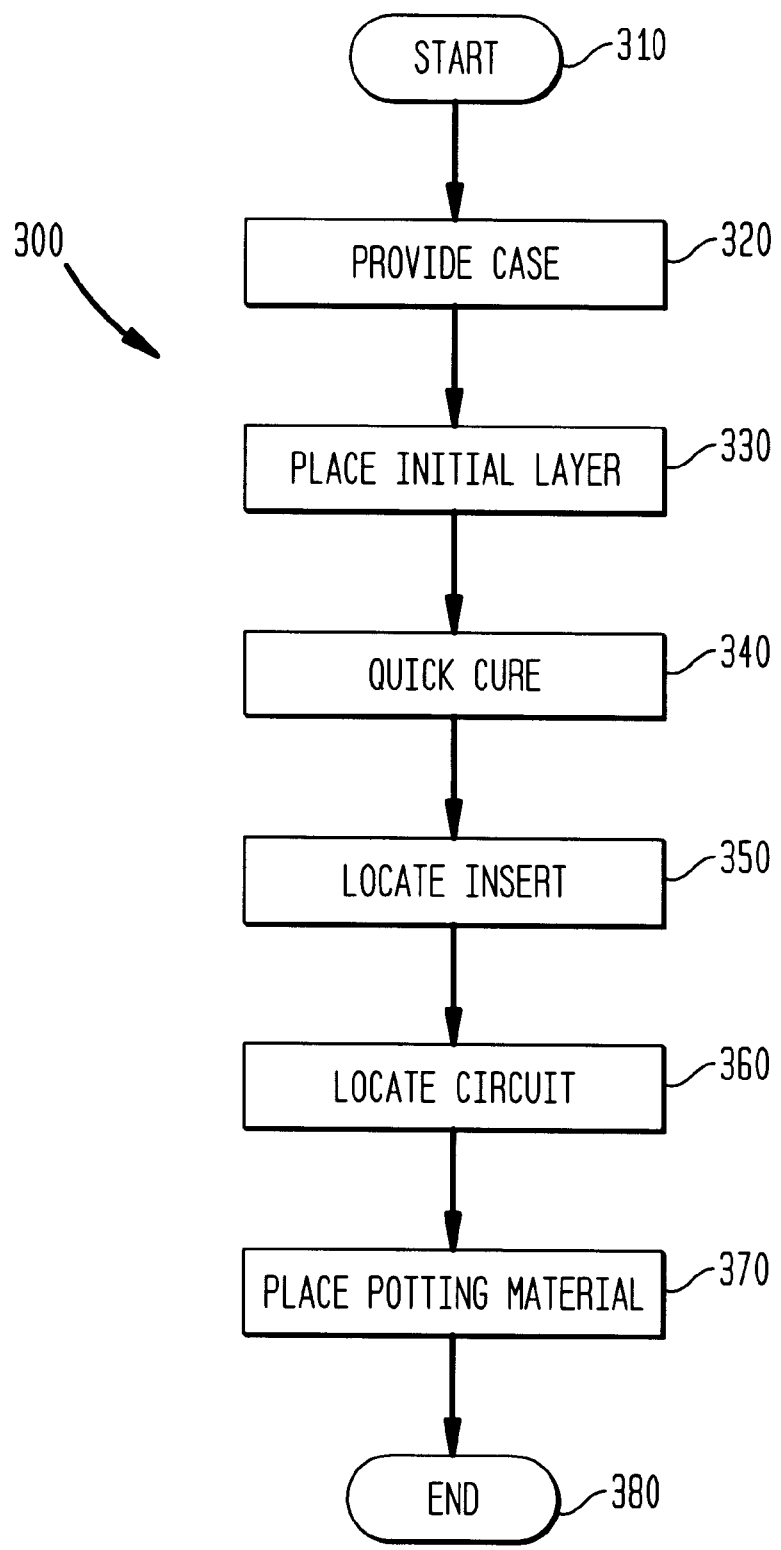
FIG. 3 illustrates an embodiment of a method of manufacture carried out in accordance with the principles of the present invention.

Turning now to FIG. 3, illustrated is an embodiment of a method 300 that is carried out according to the principles of the present invention. The method 300 provides a convenient method to assemble an electronic device that combines the favorable heat transfer characteristics of a thermally conductive insert with the heat transfer characteristics of a polymer potting material, which are generally inferior to the thermally conductive inserts.

The method 300 commences in a "start" step 310. In a "provide case" step 320, a case that is to at least partially surround the electronic circuit is provided. In a "place initial layer" step 330, an initial layer of potting material is located within the case. In one embodiment of the invention, the initial layer of potting material has a thickness of about 2 to 6 millimeters. In a "quick cure" step 340, the initial layer of potting material is quick-cured (typically by conventional techniques, such as an ultraviolet or microwave process). Of course, other methods of quick-curing the potting material is well within the broad scope of the present invention. In a "locate insert" step 350, a thermally conductive insert is located within the case. The thermally conductive insert may be precut from a sheet of material with a coefficient of thermal conductivity greater than the potting material. Alternatively, the thermally conductive insert may be premolded. In an advantageous embodiment, the thermally conductive insert may be located in the case by a machine, such as a pick and place machine. In a "locate circuit" step 360, the electronic circuit (having heat generating components thereon) is placed in the case so that the heat-generating components can be located proximate the thermally conductive insert. In a "place potting material" step 370, polymer potting material with a lower coefficient of thermally conductivity than the thermally conductive insert is placed within the case to encapsulate both the electronic circuit and the insert. The method 300 concludes in an "end" step 380.

Figure 4:
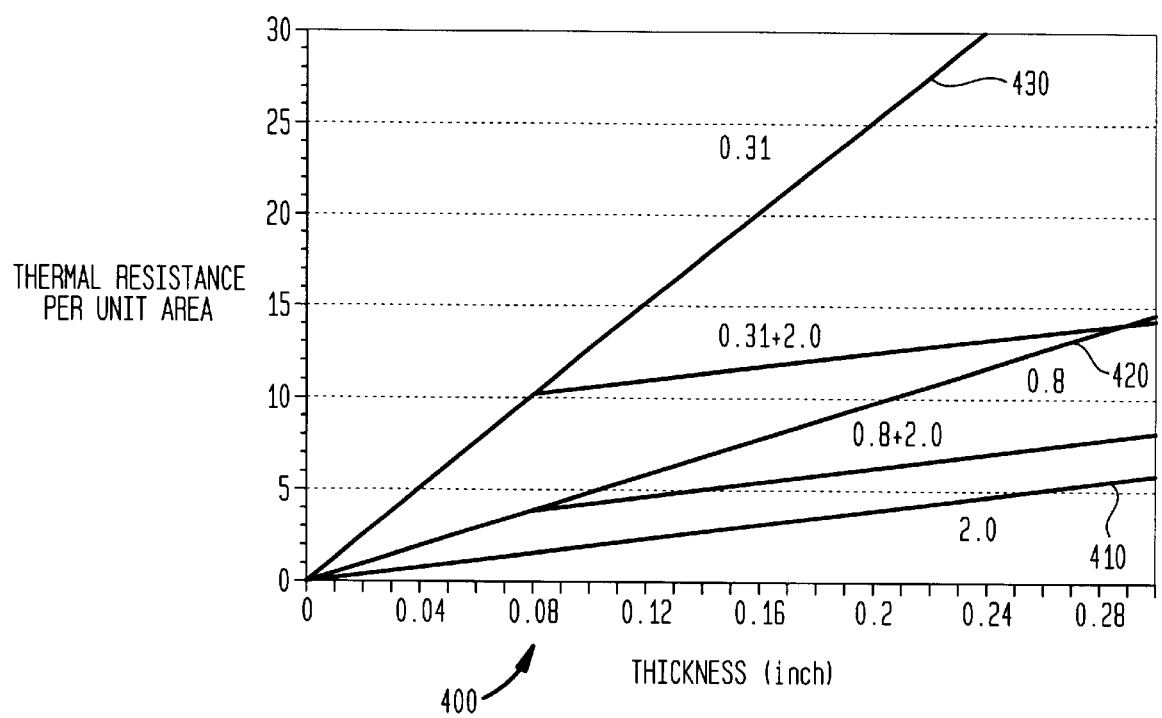
FIG. 4 illustrates a chart plotting thermal resistance per unit area as a function of thickness for combinations of materials having different coefficients of thermal resistance.

Turning to FIG. 4, illustrated is a chart plotting thermal resistance per unit area as a function of thickness for combinations of materials having different coefficients of thermal resistance. The thermal resistance of regular polymer potting material is indicated by a line 430. The result of combining regular potting material with thermally conductive inserts having higher coefficients of thermal conductivity is indicated by respective lines 410, 420.

Although the present invention has been described in detail, those skilled in the pertinent art should understand that they can make various changes, substitutions and alterations herein without departing from the spirit and scope of the invention in its broadest form.

What is claimed is:

1. An encapsulant structure, comprising:
   a case at least partially surrounding an electronic circuit having a heat-generating component;
   a thermally conductive insert located within said case proximate and at least partially surrounding at least two sides of said heat-generating component, that increases heat transfer efficiency from said electronic circuit to said case; and
   a potting material, having a lower coefficient of thermal conductivity than said insert, and encapsulating both said electronic circuit and said insert.

2. The encapsulant structure as recited in claim 1 wherein said thermally conductive insert has a general topographical conformity to said electronic circuit.

3. The encapsulant structure as recited in claim 1 wherein said thermally conductive insert is premolded.

4. The encapsulant structure as recited in claim 1 wherein said thermally conductive insert is flexible and compliant.

5. The encapsulant structure as recited in claim 1 wherein a plurality of said thermally conductive inserts are located within said case.

6. The encapsulant structure as recited in claim 1 wherein said thermally conductive insert is compressible.

7. A method of manufacturing an encapsulated electronic circuit, comprising:

providing an electronic circuit having a heat generating component;

providing a case to at least partially surround said electronic circuit;

locating a thermally conductive insert within said case proximate and at least partially surrounding at least two sides of said electronic circuit component, to increase heat transfer efficiency from said electronic circuit to said case, and locating potting material, having a lower coefficient of thermal conductivity than said insert, in said case to encapsulate both said electronic circuit and said insert.

8. The method of manufacturing as recited in claim 7 wherein said thermally conductive insert has a general topographical conformity to said electronic circuit.

9. The method of manufacturing as recited in claim 7 wherein said thermally conductive insert is premolded.

10. The method of manufacturing as recited in claim 7 wherein said thermally conductive insert is flexible and compliant.

11. The method of manufacturing as recited in claim 7 wherein a plurality of said thermally conductive inserts are located within said case.

12. The method of manufacturing as recited in claim 7 wherein said thermally conductive insert is precut from a sheet of material.

13. The method of manufacturing as recited in claim 7 wherein said thermally conductive insert is compressible.

14. The method of manufacturing as recited in claim 7 wherein said locating of said thermally conductive insert includes locating said thermally conductive insert using a pick-and-place machine.

15. A method of manufacturing an encapsulated electronic circuit having heat-generating components, comprising:

providing a case to at least partially surround said electronic circuit;

placing an initial layer of potting material within said case and quick-curing said initial layer;

locating a thermally conductive insert within said case;

locating said electronic circuit in said case, with said heat-generating components proximate said thermally conductive insert; and placing potting material, having a lower coefficient of thermal conductivity than said insert, in said case to encapsulate both said electronic circuit and said insert.

16. The method of manufacturing as recited in claim 15 wherein said thermally conductive insert is precut from a sheet of material having a coefficient of thermal conductivity greater than said potting material.

17. The method of manufacturing as recited in claim 15 wherein said locating of said thermally conductive insert includes locating said thermally conductive insert using a pick-and-place machine.

18. The method of manufacturing as recited in claim 15 wherein said initial layer of said potting material within said case has a thickness of about 2 to 6 millimeters.

19. The method of manufacturing as recited in claim 15 wherein said initial layer of said potting material within said case is quick cured using a process selected from the group consisting of:

an ultraviolet process; and a microwave process.

20. An electronic device, comprising:

a substrate adapted to receive electronic components; and an encapsulant structure for an electronic circuit, wherein the electronic circuit has heat generating components and is mounted on said substrate, including:

a case at least partially surrounding said electronic circuit; and a thermally conductive insert located within said case proximate and at least partially surrounding at least two sides of said heat-generating components, that increases heat transfer efficiency from said electronic circuit to said case; and a potting material, having a lower coefficient of thermal conductivity than said insert, that encapsulates both said electronic circuit and said insert.

21. The electronic device as recited in claim 20 wherein said thermally conductive insert has a general topographical conformity to said electronic circuit.

22. The electronic device as recited in claim 20 wherein said thermally conductive insert is premolded.

23. The electronic device as recited in claim 20 wherein said thermally conductive insert is flexible and compliant.

24. The electronic device as recited in claim 20 wherein a plurality of said thermally conductive inserts are located within said case.

25. The electronic device as recited in claim 20 wherein said thermally conductive insert is compressible.

* * * * *